(12) United States Patent
Nakashimo (10) Patent No.: US 6,570,426 B2
(45) Date of Patent: May 27, 2003

(54) DELAY CIRCUIT

(75) Inventor: Takao Nakashimo, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/079,158

(22) Filed: Feb. 20, 2002

(65) Prior Publication Data

US 2002/0140474 A1 Oct. 3, 2002

(30) Foreign Application Priority Data

Mar. 30, 2001 (JP) ........................................ 2001-100751

(51) Int. Cl.[7] ............................................... H03H 11/26
(52) U.S. Cl. ..................... 327/265; 327/273; 327/279
(58) Field of Search ................................. 327/151, 160, 327/262, 263, 264, 265, 273, 279, 286

(56) References Cited

U.S. PATENT DOCUMENTS

| | | | | |
|---|---|---|---|---|
| 3,576,496 A | * | 4/1971 | Garagnon | 327/265 |
| 5,731,725 A | * | 3/1998 | Rothenberger et al. | 327/262 |
| 6,215,345 B1 | * | 4/2001 | Yashiba et al. | 327/279 |

* cited by examiner

*Primary Examiner*—Tuan T. Lam
(74) *Attorney, Agent, or Firm*—Adams & Wilks (57) ABSTRACT

In a delay circuit, a voltage detecting circuit is additionally provided. This voltage detecting circuit detects such a condition that a voltage appeared at a measuring terminal of the delay circuit is shifted from a predetermined voltage range for a time duration longer than, or equal to a preset time duration. Even when the measuring terminal of the delay circuit is short-circuited to the power supply voltage, or the ground potential, this delay circuit firmly inverts the output signal level based on delay time set by an internal delay circuit.

2 Claims, 8 Drawing Sheets

DELAY CIRCUIT

BACKGROUND OF THE INVENTION

1. Field of the Invention

The present invention relates to a delay circuit equipped with a clock circuit and a counter circuit for producing desirable delay time by using a clock signal outputted from the clock circuit.

2. Description of the Related Art

Figure 7:
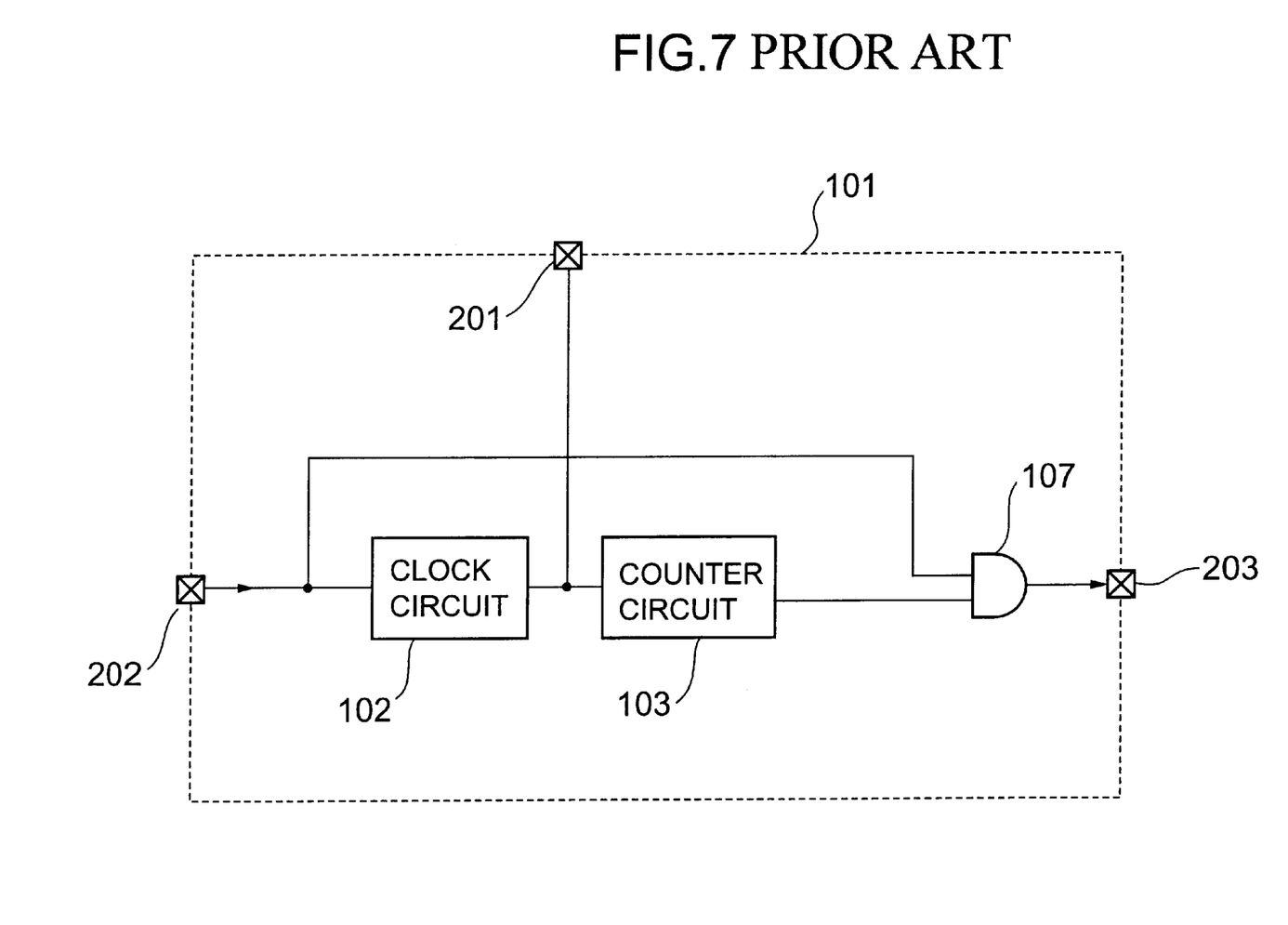
FIG. 7 is an explanatory diagram for explanatory the circuit block of the conventional delay circuit.

Referring now to FIG. 7, an example of a conventional delay circuit will be described.

In this conventional delay circuit, an input signal of a delay circuit 101 constitutes an input signal for a clock circuit 102. This clock circuit 102 outputs a rectangular wave signal having a constant time period as an output signal after such a time instant when the above-described input signal is entered to this clock circuit 102. An input signal of a counter circuit 103 corresponds to the output signal of the clock circuit 102. While the counter circuit 103 senses such a condition that a signal level of an input signal is changed from either a high level to a low level or a low level to a high level, the counter circuit 103 outputs such an output signal having a high level when a total wave number of the rectangular waves corresponding to the input signal thereof becomes a predetermined number.

An AND gate circuit 107 senses such a state that both the input signal level of the delay circuit 101 and the output signal level of the counter circuit 103 become high levels, so that this AND gate circuit 107 outputs an output signal of the delay circuit 101.

Figure 8:
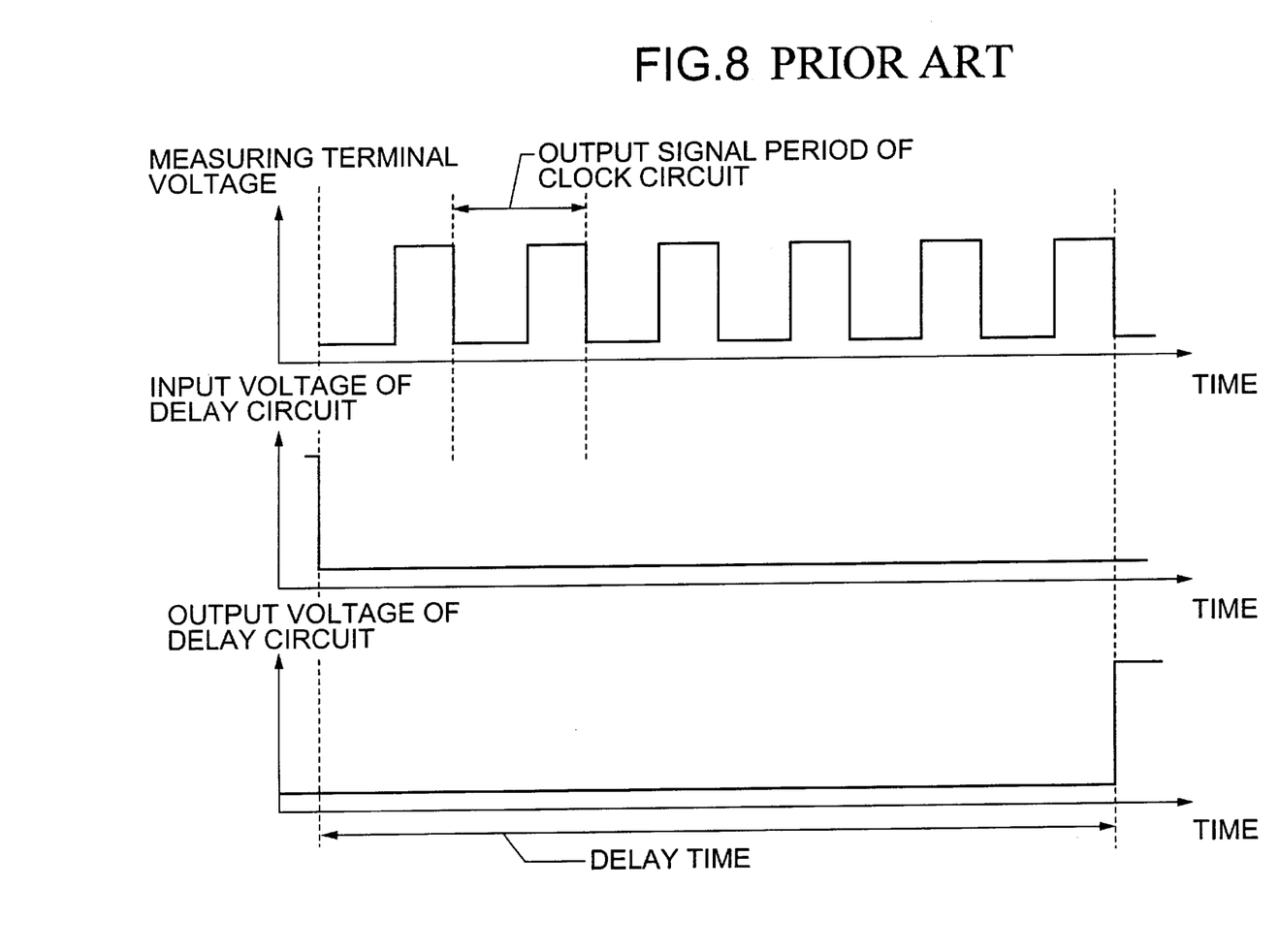
FIG. 8 is an explanatory diagram for showing the output signals of the conventional delay circuit shown in FIG. 7.

As a result, as shown in FIG. 8, delay time of this delay circuit 101 is equal to:

detected wave number of counter circuit 103×time period of signal outputted from clock circuit 102    (1).

In the above-described conventional delay circuit 101, a measuring terminal 201 is provided between the output terminal of the clock circuit 102 and the input terminal of the counter circuit 103 so as to test delay time of this delay circuit 101. This delay time test may be carried out as follows. That is, a time period of an output signal of the clock circuit 102 may be measured by using this measuring terminal 201. Also, while such a rectangular wave having a shorter time period than the time period of the output signal of the clock circuit 102 is inputted so as to shorten the delay time of the delay circuit 101, the shortened delay time may be tested. However, in the case that the delay circuit 101 is made by employing the above-described circuit arrangement, there is the below-mentioned problem.

In the case that this delay circuit 101 is used, when the measuring terminal 201 is short-circuited to either the power supply voltage (will be referred to as a "VDD" hereinafter) or the ground potential (will be referred to as a "VSS" hereinafter), the signal level of the input signal of the counter circuit 103 is not changed from either the high level to the low level or from the low level to the high level. As a result, the counter circuit 103 cannot produce the output signal, but also the delay circuit 101 cannot be operated under normal condition, so that this delay circuit 101 cannot produce the output signal.

In general, circuits provided for protection purposes and also provided in order to improve safety characteristics should be continuously brought into a so-called "fail safe" state. Namely, even when a failure happens to occur in these circuits, certain sorts of protection may be made. In the case of delay circuits, even when delay time thereof is not equal to defined delay time values, these delay circuits are necessarily required to be operated in such a manner that output voltages thereof are inverted, and thus, signals are sent out from these delay circuits.

SUMMARY OF THE INVENTION

The present invention has been made to solve the above-explained problem, and therefore, has an object to provide such a delay circuit comprising: a clock circuit for outputting at least a clock having a constant time period; a measuring terminal capable of measuring the clock output of said clock circuit; and a counter circuit for producing desirable delay time by using the clock output of the clock circuit; in which; even when the measuring terminal capable of measuring the clock output of the clock circuit is short-circuited to another wiring line, the delay circuit firmly controls charge and discharge operations.

In other words, a voltage detecting circuit is additionally employed in the delay circuit. This voltage detecting circuit detects such a condition that a voltage appeared at a measuring terminal of the delay circuit is shifted from a predetermined voltage range for a time duration longer than, or equal to a preset time duration. Even when the measuring terminal of the delay circuit is short-circuited to the power supply voltage, or the ground potential, this delay circuit can firmly invert the output signal level based on delay time set by an internal delay circuit.

BRIEF DESCRIPTION OF THE DRAWINGS

A more better understanding of the present invention may be made of reading a detailed description of the specification in conjunction with the accompanying drawings, in which.

DETAILED DESCRIPTION OF THE PREFERRED EMBODIMENTS

Figure 1:
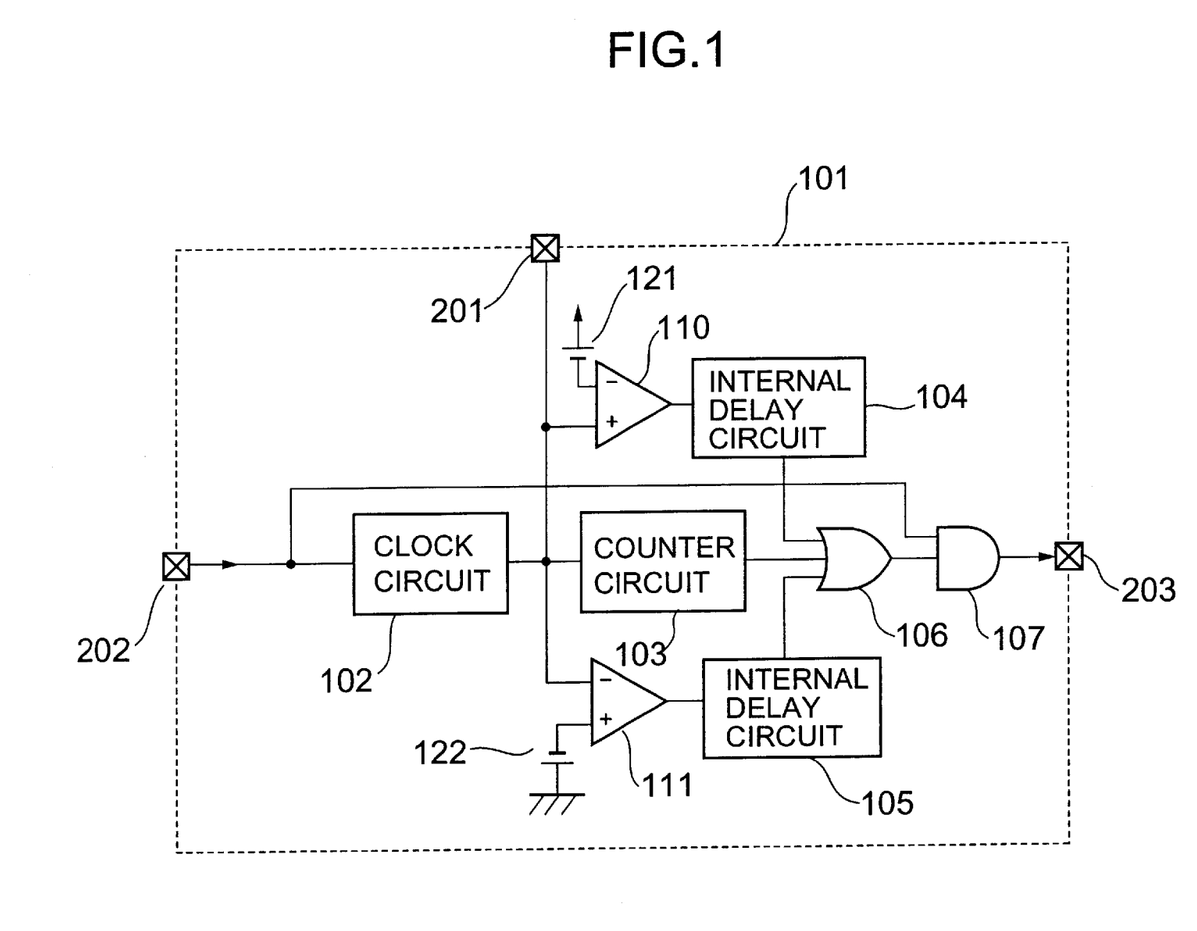
FIG. 1 is an explanatory diagram for explaining a circuit block of a delay circuit according to an embodiment of the present invention.

Referring now to FIG. 1 a delay circuit 101 according to an embodiment of the present invention will be described.

In this delay circuit 101 of the present embodiment, an input signal of the delay circuit 101 constitutes an input signal for a clock circuit 102. This clock circuit 102 outputs a rectangular wave signal having a constant time period as an output signal after such a time instant when the above-described input signal is entered to this clock circuit 102.

An input signal of a counter circuit 103 corresponds to the output signal of the clock circuit 102. While the counter circuit 103 senses such a condition that a signal level of an input signal is changed from either a high level to a low level or a low level to a high level, the counter circuit 103 outputs such an output signal having a high level when a total wave number of the rectangular waves corresponding to the input signal thereof becomes a predetermined number.

A voltage detecting comparator 111 senses such a condition that a voltage of a measuring terminal 201 is lower than a voltage value of a reference voltage 122, so that this voltage detecting comparator 111 inverts a level of an output signal from a low level into a high level.

An internal delay circuit 105 enters the output signal from the voltage detecting comparator 111 as an input signal, and produces an output signal after preset delay time has passed. This delay time is set to be longer than the low level period of the output signal having the rectangular wave, which is outputted from the clock circuit 102.

Another voltage detecting comparator 110 senses such a condition that a voltage of the measuring terminal 201 becomes higher than (VDD-voltage value of reference voltage 121), so that this voltage detecting comparator 110 inverts a level of an output signal from a low level into a high level.

Another internal delay circuit 104 enters the output signal from the voltage detecting comparator 110 as an input signal, and produces an output signal after preset delay time has passed. This delay time is set to be longer than the high level period of the output signal having the rectangular wave, which is outputted from the clock circuit 102.

An OR gate circuit 106 senses such a state that any one of the output signals derived from the internal delay circuits 104 and 105, and also the counter circuit 103 is inverted, so that this OR gate circuit 106 produces an output signal.

An AND gate circuit 107 senses such a state that signal levels of both the input signal of the delay circuit 201 and the output signal of the OR gate circuit 106 become high levels, so that this AND gate circuit 107 outputs an output signal of this delay circuit 201.

Figure 2:
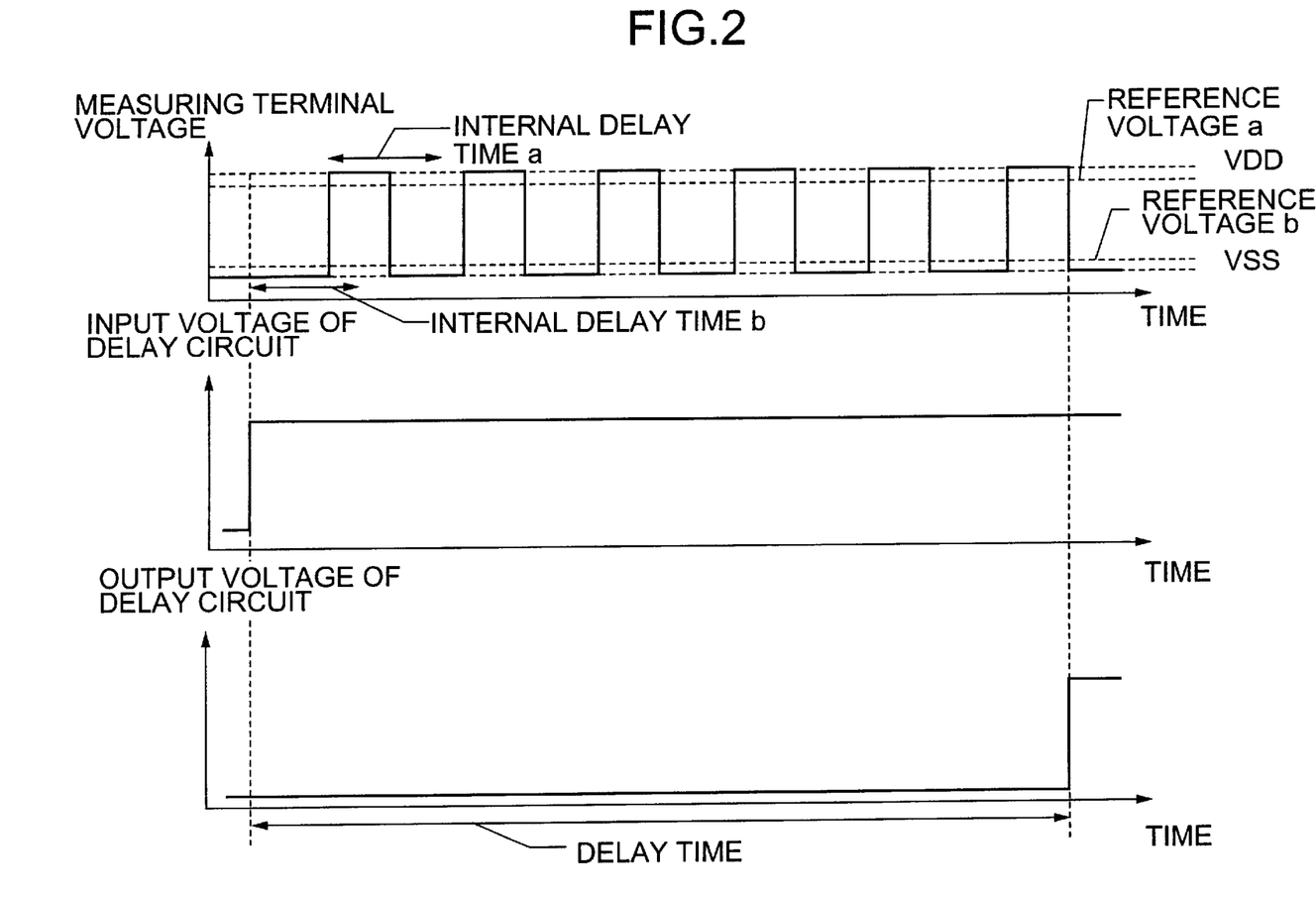
FIG. 2 is an explanatory diagram for explaining output signals of the delay circuit according to the embodiment.

Operations of this delay circuit 101 when the measuring terminal 201 is opened will be firstly explained with reference to FIG. 2. In the case that an input signal is entered into the delay circuit 101, the clock circuit 102 outputs a rectangular wave signal having a constant time period as an output signal from a time instant when this input signal is entered. Since the measuring terminal 201 is opened, a signal level of a voltage appeared at the measuring terminal 201 is repeated between a high level and a low level in a constant time period.

When a voltage appeared at the measuring terminal 201 becomes lower than the voltage value of the reference voltage 122 within the low-leveled time period of the rectangular wave signal, the signal level of the output signal from the voltage detecting comparator 111 is inverted from the low level to the high level. However, since the low-leveled time period of this rectangular wave signal is shorter than the delay time of the internal delay circuit 105, the output signal level of the comparator 111 is inverted from the high level to the low level before the output signal level of the internal delay circuit 105 is inverted, so that the output signal level of the internal delay circuit 105 remains at the low level.

When a voltage appeared at the measuring terminal 201 becomes higher than the voltage value of the reference voltage 121 within the high-leveled time period of the rectangular wave signal, the signal level of the output signal from the voltage detecting comparator 110 is inverted from the low level to the high level. However, since the high-leveled time period of this rectangular wave signal is shorter than the delay time of the internal delay circuit 104, the output signal level of the comparator 110 is inverted from the high level to the low level before the output signal level of the internal delay circuit 104 is inverted, so that the output signal level of the internal delay circuit 104 remains at the low level.

The output signal level of the OR gate circuit 106 is not inverted until the output signal level of the counter circuit 103 becomes the high level. Since the AND gate circuit 107 does not output the output signal of the delay circuit 101 until both the input signal level of the delay circuit 101 and the output signal level of the OR gate circuit 106 become the high levels, the delay time of the delay circuit 101 may be defined by the above-explained formula (1).

Figure 3:
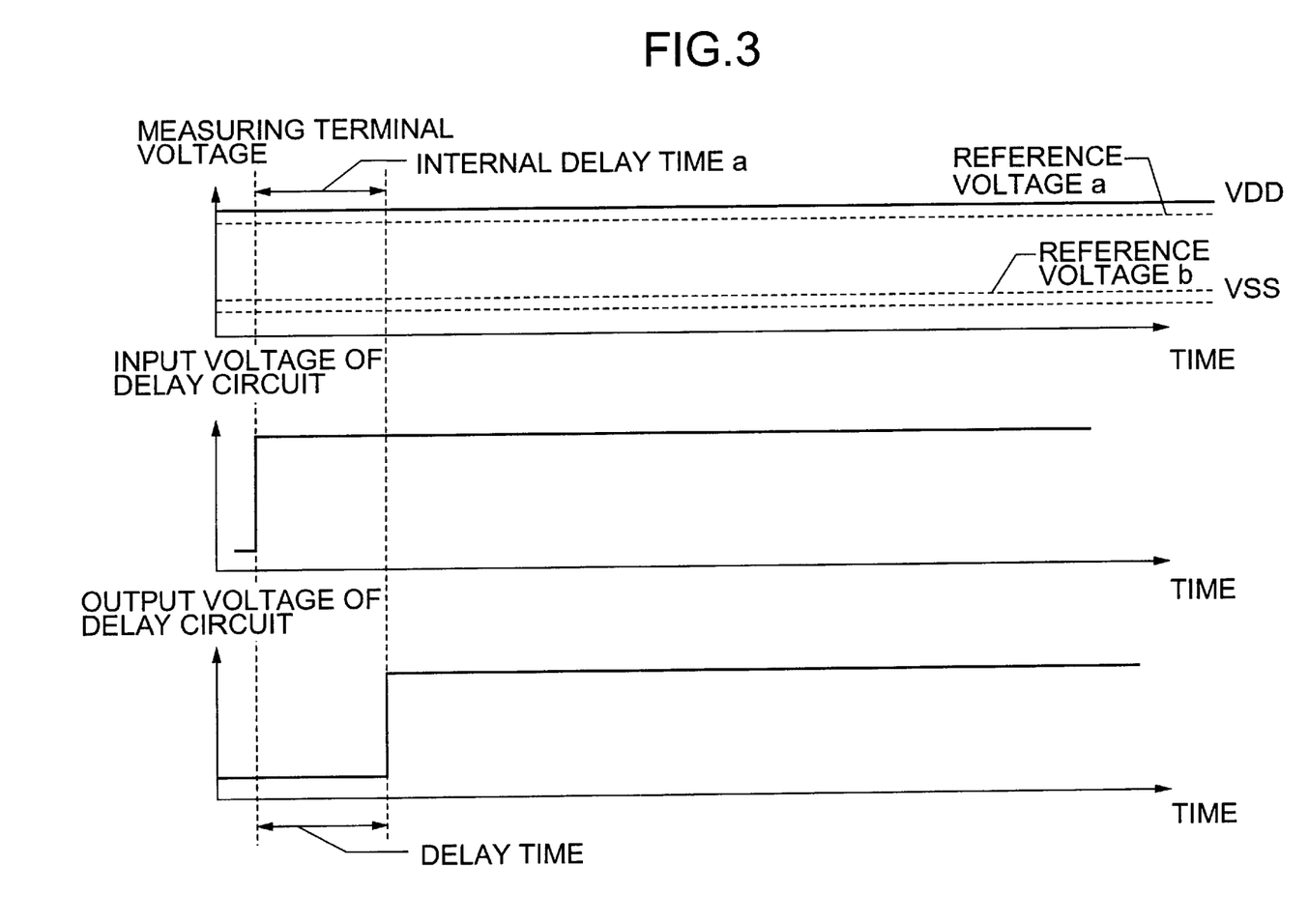
FIG. 3 is another explanatory diagram for describing output signals of the delay circuit according to the embodiment.

Referring now to FIG. 3, a description will be made of operations of the delay circuit 101 in such a case that the measuring terminal 201 is short-circuited with the power supply voltage VDD due to a certain aspect of an external circuit. Under such a condition that the output signal level of the voltage detecting comparator 110 is inverted form the low level to the high level. The output signal level of the internal delay circuit 104 is inverted from the low level to the high level after internal delay time "a" has passed. The output signal level of the OR gate circuit 106 is inverted, and the AND gate circuit 107 inverts the output signal level thereof.

As a result, the delay circuit 101 inverts the output signal level based upon the delay time "a" set by the internal delay circuit 104.

Figure 4:
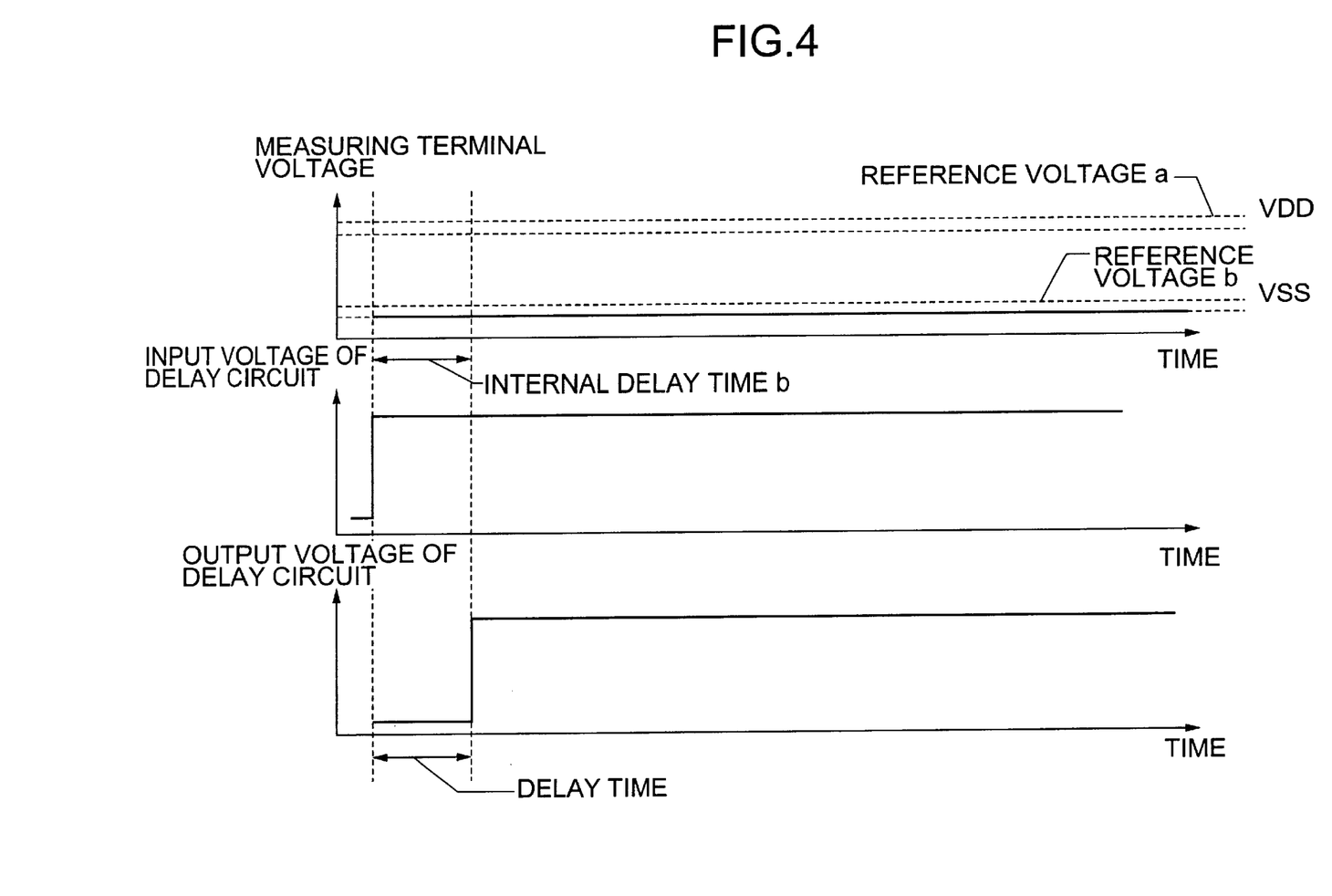
FIG. 4 is another explanatory diagram for describing output signals of the delay circuit according to the embodiment.

Referring now to FIG. 4, a description will be made of operations of the delay circuit 101 in such a case that the measuring terminal 201 is short-circuited with the ground potential VSS due to a certain aspect of an external circuit. Under such a condition that the output signal level of the voltage detecting comparator 111 is inverted form the low level to the high level. The output signal level of the internal delay circuit 105 is inverted from the low level to the high level after internal delay time "b" has passed. The output signal level of the OR gate circuit 106 is inverted, and the AND gate circuit 107 outputs the output signal of the delay circuit 101. As a result, the delay circuit 101 inverts the output signal level based upon the delay time "b" set by the internal delay circuit 105.

As previously explained, even in such a case that the output terminal 201 is short-circuited to VDD and/or VSS, the delay circuit 101 according to this embodiment may invert the output signal levels based upon the delay time "a", "b" which are set by the internal delay circuits 104 and 105.

Figure 5:
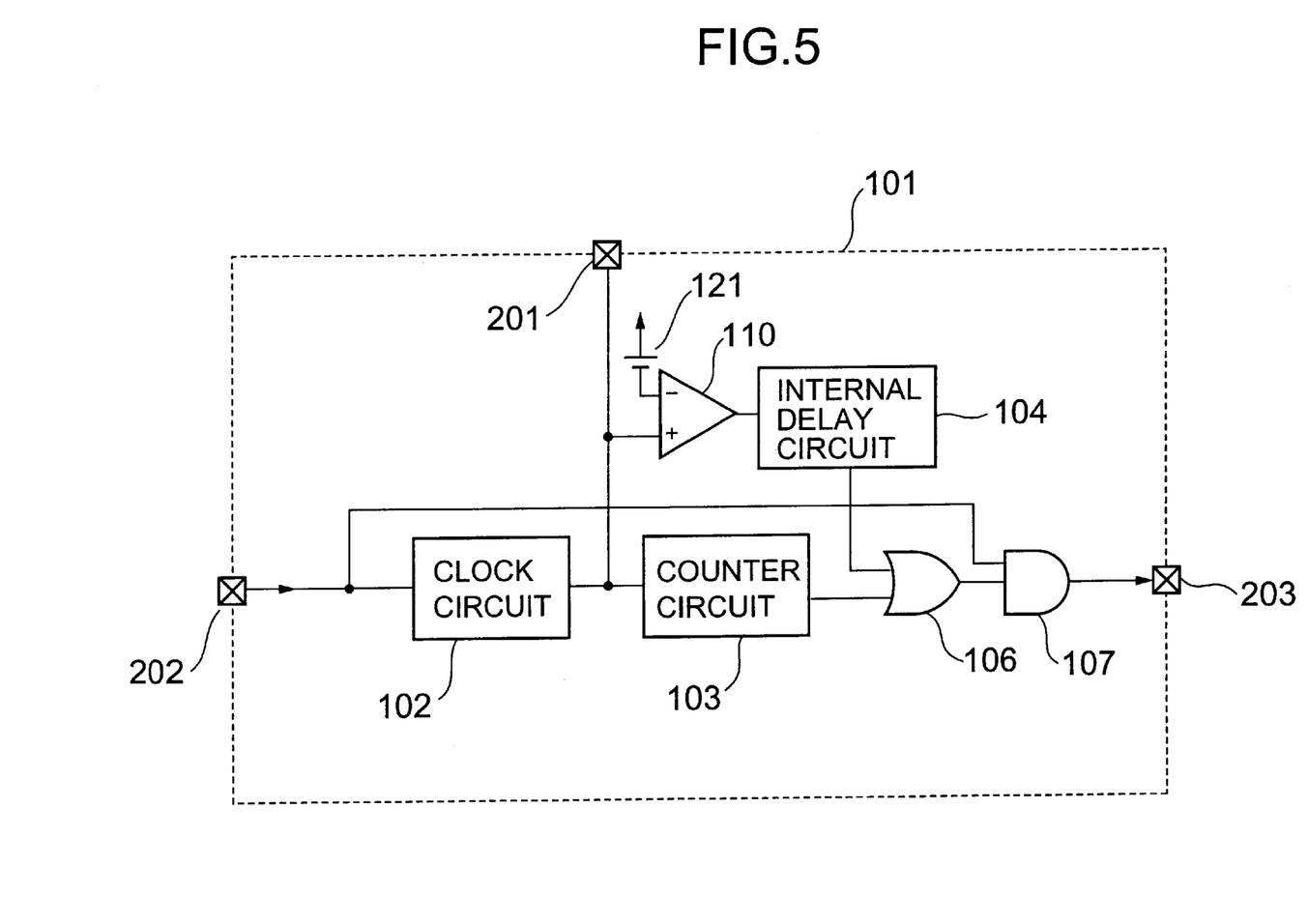
FIG. 5 is an explanatory diagram for explaining a circuit block of a delay circuit according to another embodiment of the present invention.
Figure 6:
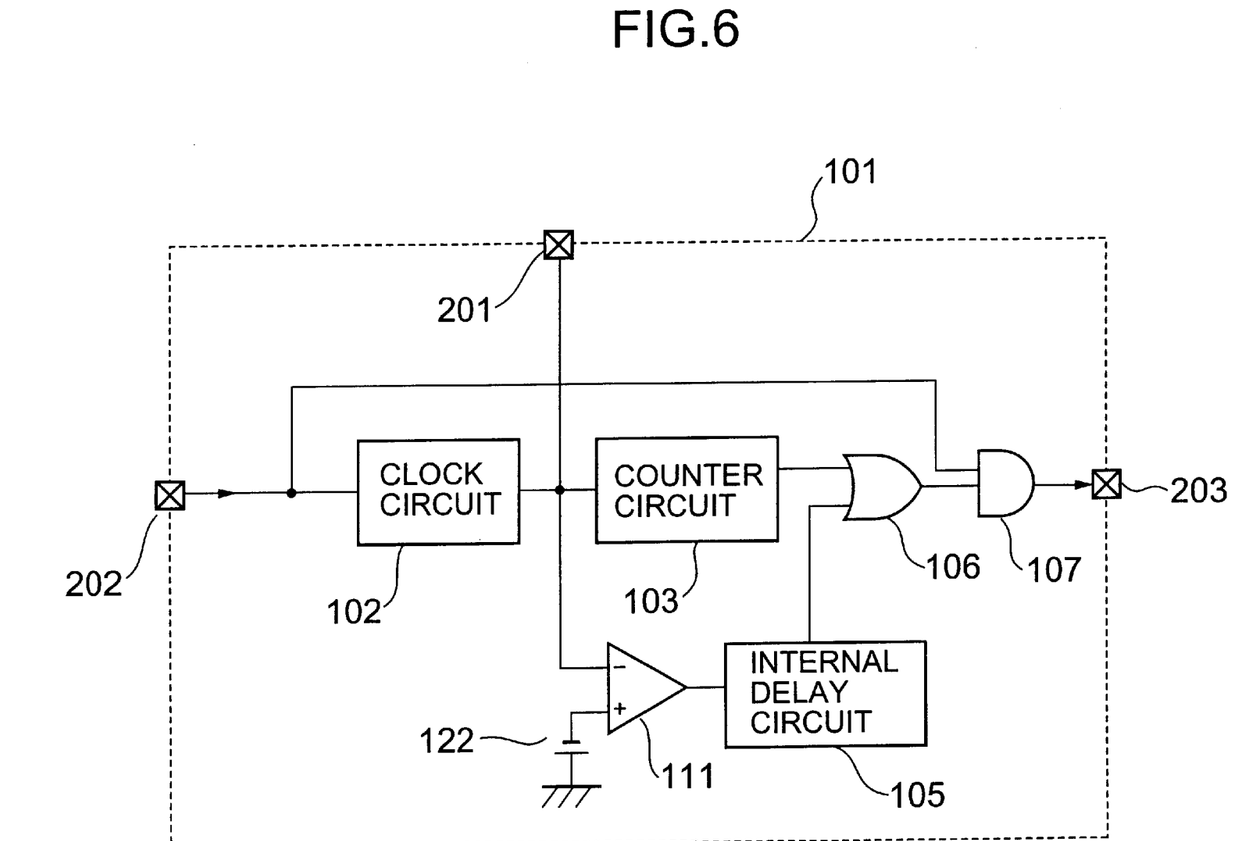
FIG. 6 is an explanatory diagram for explaining a circuit block of a delay circuit according to a further embodiment of the present invention.

Alternatively, as represented in FIG. 5, in accordance with the present invention, another delay circuit may be arranged only by employing the voltage detecting comparator 110 provided on the high level side. Similarly, as indicated in FIG. 6, a further delay circuit may be arranged only by employing the voltage detecting comparator 111 provided on the low level side.

While the present invention has been described in detail, even when the voltage measuring terminal employed in the delay circuit is short-circuited to VDD, or VSS, this delay circuit according to the present invention may invert the output signal levels based upon the delay time set by the internal delay circuit.

What is claimed is:

1. A delay circuit comprising:

a clock circuit for outputting at least a clock having a constant time period;

a measuring terminal for measuring the clock output of said clock circuit; and a counter circuit for producing desirable delay time by using the clock output of said clock circuit, wherein: even when said measuring terminal for measuring the clock output of said clock circuit is short-circuited to another wiring line, said delay circuit firmly controls charge and discharge operations.

2. A delay circuit comprising:

a clock circuit having an input terminal;

a first voltage comparator having an inversion terminal connected to a first reference voltage and noninversion terminal connected with an output of the clock circuit and a test terminal;

a first internal delay circuit connected to an output of the first voltage comparator;

a counter circuit inputting an output of the clock circuit;

a second voltage comparator having an inversion terminal connected to an output of the clock circuit and noninversion terminal connected to a second reference voltage;

a second internal delay circuit connected to an output of the second comparator;

an OR circuit connected with on output of the first internal delay circuit, an output of the second internal delay circuit and an out of the counter circuit;

an AND circuit connected with the input terminal and an output of the OR circuit.

* * * * *